US008952774B2

(12) United States Patent
Dolgonos

(10) Patent No.: US 8,952,774 B2
(45) Date of Patent: Feb. 10, 2015

(54) HEAT EXCHANGER WITH MAGNETIC LOCK

(71) Applicant: 2064818 Ontario Inc., Thornhill (CA)

(72) Inventor: Alex Dolgonos, Thornhill (CA)

(73) Assignee: 2064818 Ontario Inc., Thornhill (CA)

( * ) Notice: Subject to any disclaimer, the term of this patent is extended or adjusted under 35 U.S.C. 154(b) by 261 days.

(21) Appl. No.: 13/663,615

(22) Filed: Oct. 30, 2012

(65) Prior Publication Data

US 2013/0105113 A1 May 2, 2013

Related U.S. Application Data

(60) Provisional application No. 61/554,542, filed on Nov. 2, 2011.

(51) Int. Cl.

| | |
|---|---|
| ***H05K 7/20*** | (2006.01) |
| ***G06F 1/20*** | (2006.01) |
| ***H05K 5/00*** | (2006.01) |
| ***H01F 7/20*** | (2006.01) |
| ***F28F 9/00*** | (2006.01) |
| ***F28F 9/007*** | (2006.01) |
| ***H01F 7/06*** | (2006.01) |

(52) U.S. Cl.
CPC *F28F 9/007* (2013.01); *H01F 7/06* (2013.01); *F28F 2280/00* (2013.01)
USPC ......... 335/289; 361/707; 361/679.46; 165/67

(58) Field of Classification Search
CPC ...................................... F28F 9/00; F28F 9/02
USPC ....................... 361/679.46, 679.47, 715, 716, 361/724–727, 707; 335/285–289; 165/67
See application file for complete search history.

(56) References Cited

U.S. PATENT DOCUMENTS

| | | | | |
|---|---|---|---|---|
| 4,009,423 | A | 2/1977 | Wilson | |
| 6,151,206 | A * | 11/2000 | Kato et al. | 361/679.26 |
| 6,459,574 | B1 * | 10/2002 | Ghosh | 361/679.46 |
| 7,099,158 | B1 * | 8/2006 | Bjorklund | 361/725 |
| 7,205,872 | B2 * | 4/2007 | Baechle et al. | 335/207 |
| 7,541,907 | B2 * | 6/2009 | Wang et al. | 335/305 |
| 7,719,836 | B2 * | 5/2010 | Franz et al. | 361/695 |
| 7,804,690 | B2 * | 9/2010 | Huang et al. | 361/724 |
| 7,907,409 | B2 | 3/2011 | Wyatt et al. | |
| 7,948,378 | B2 * | 5/2011 | Magargee et al. | 340/547 |
| 8,373,989 | B2 * | 2/2013 | Gong et al. | 361/695 |

(Continued)

*Primary Examiner* — Alexander Talpalatski
(74) *Attorney, Agent, or Firm* — Marshall & Melhorn, LLC

(57) ABSTRACT

A magnetic lock system for releasably securing a heat exchanger with a component. The system includes: an electromagnet on one of the heat exchanger or the component and a magnetic region on the other of the heat exchanger or the component; the electromagnet being energizable to attract the magnetic region to secure the component and the heat exchanger in a thermally coupled position; and the electromagnet being de-energizable to release the component and the heat exchanger from the thermally coupled position. Also a magnetic lock system for releasably securing a heat exchanger with a component, the system includes: an electromagnet on one of the heat exchanger or the component and a magnet on the other of the heat exchanger or the component; magnetic attraction between the magnet and the electromagnet securing the component and the heat exchanger in a thermally coupled position when the electromagnet is not energized, the electromagnet being energizable to repel the magnet to release the component and the heat exchanger from the thermally coupled position.

22 Claims, 5 Drawing Sheets

(56) References Cited

U.S. PATENT DOCUMENTS

| | | | | |
|---|---|---|---|---|
| 8,441,793 | B2 * | 5/2013 | Dunwoody et al. | 361/699 |
| 8,537,540 | B2 * | 9/2013 | Landon | 361/679.54 |
| 8,610,523 | B2 * | 12/2013 | Ku et al. | 335/219 |
| 8,618,898 | B2 * | 12/2013 | Noble et al. | 335/289 |
| 8,779,877 | B2 * | 7/2014 | Fullerton et al. | 335/285 |
| 2001/0008480 | A1 * | 7/2001 | Huang | 361/687 |
| 2005/0083651 | A1 * | 4/2005 | Smith et al. | 361/687 |
| 2005/0254210 | A1 * | 11/2005 | Grady et al. | 361/695 |
| 2007/0103266 | A1 * | 5/2007 | Wang et al. | 335/285 |
| 2007/0297136 | A1 | 12/2007 | Konshak | |
| 2008/0094158 | A1 * | 4/2008 | Schmid | 335/291 |
| 2009/0244830 | A1 * | 10/2009 | Wyatt et al. | 361/679.47 |
| 2010/0032140 | A1 | 2/2010 | Copeland | |
| 2012/0020008 | A1 * | 1/2012 | Dunwoody et al. | 361/679.46 |

* cited by examiner

HEAT EXCHANGER WITH MAGNETIC LOCK

FIELD OF TECHNOLOGY

The present disclosure relates to heat exchange systems and more particularly to a cooling system for modular components such as electrical components.

BACKGROUND

Electronic systems often include components, including for example high power amplifiers, which generate significant amounts of heat. These components may be modular and may be mounted in a rack or chassis, and may be cooled by heat exchangers. With the ability to remove and replace components within the rack or chassis, it may be desirable to have an improved interface between the components and the heat exchangers.

SUMMARY

According to one embodiment is a magnetic lock system for releasably securing a heat exchanger with a component. The system includes: an electromagnet on one of the heat exchanger or the component and a magnetic region on the other of the heat exchanger or the component; the electromagnet being energizable to attract the magnetic region to secure the component and the heat exchanger in a thermally coupled position; and the electromagnet being de-energizable to release the component and the heat exchanger from the thermally coupled position.

According to one embodiment is a component mounting system, including a support structure, a heat exchanger mounted to the support structure, a component adapted to be removably mounted to the support structure, an electromagnet on one of the heat exchanger or the component and a magnetic region on the other of the heat exchanger or the component. The electromagnet is energizable to attract the magnetic region to secure the component and the heat exchanger in a thermally coupled position when the heat exchanger and the component are located adjacent each other in the support structure. The electromagnet is de-energizable to release the component and the heat exchanger from the thermally coupled position to allow the component to be removed independently of the heat exchanger from the support structure.

According to one embodiment is a method of releasably securing an electronic component to a heat exchanger, the heat exchanger defining an internal fluid flow path for a heat exchanger fluid flowing therethrough. The method includes: providing one or more electromagnets on one of the heat exchanger or the component and one or more magnetic regions on the other of the heat exchanger or the component; energizing the one or more electromagnets to attract the one or more magnetic regions to secure the component and the heat exchanger in a thermally coupled position; and de-energizing the one or more electromagnets to release the component and the heat exchanger from the thermally coupled position.

According to one example is a cooling system for an electrical component mounted in a support structure. The cooling system includes a heat exchanger; a cooling module in fluid communication with the heat exchanger; and an electromagnet on one of the heat exchanger or the electrical component. When the electromagnet is energized, the electromagnet secures the electrical component mounted in the support structure and the heat exchanger in a thermally coupled position; and when the electromagnet is de-energized, the electrical component can be removed from the support structure.

According to another example is a heat exchanger. The heat exchanger includes a thermally couplable portion for coupling with an electrical component; and an electromagnet for magnetically attracting a magnet or ferromagnetic portion of the electrical component to secure the heat exchanger and the electrical component in a thermally coupled position.

According to another example is an electrical component. The electrical component includes a thermally couplable portion for coupling with a heat exchanger; and an electromagnet for magnetically attracting a magnet or ferromagnetic portion of the heat exchanger to secure the electrical component and the heat exchanger in a thermally coupled position.

According to another example is a method of cooling an electrical component. The method includes detecting the electrical component is in a couplable position; and upon detecting the electrical component is in a couplable position, energizing an electromagnet to secure the electrical component and a heat exchanger in a thermally coupled position. In some examples, the method also includes receiving a disengagement signal; and upon receiving the disengagement signal, de-energizing the electromagnet.

A magnetic lock system for releasably securing a heat exchanger with a component, the system including: an electromagnet on one of the heat exchanger or the component and a magnet on the other of the heat exchanger or the component; magnetic attraction between the magnet and the electromagnet securing the component and the heat exchanger in a thermally coupled position when the electromagnet is not energized, the electromagnet being energizable to repel the magnet to release the component and the heat exchanger from the thermally coupled position.

A method of releasably securing an electronic component to a heat exchanger, the heat exchanger defining an internal fluid flow path for a heat exchanger fluid flowing therethrough, the method including: providing one or more electromagnets on one of the heat exchanger or the component and one or more magnets on the other of the heat exchanger or the component; positioning the component and the heat exchanger adjacent each other so that magnetic attraction between the one or more electromagnets and the one or more magnets secure the component and the heat exchanger in a thermally coupled position; and energizing the one or more electromagnets to release the component and the heat exchanger from the thermally coupled position.

BRIEF DESCRIPTION OF THE DRAWINGS

Embodiments of the present disclosure will now be described, by way of example only, with reference to the attached figures, wherein.

DETAILED DESCRIPTION

Figure 1:
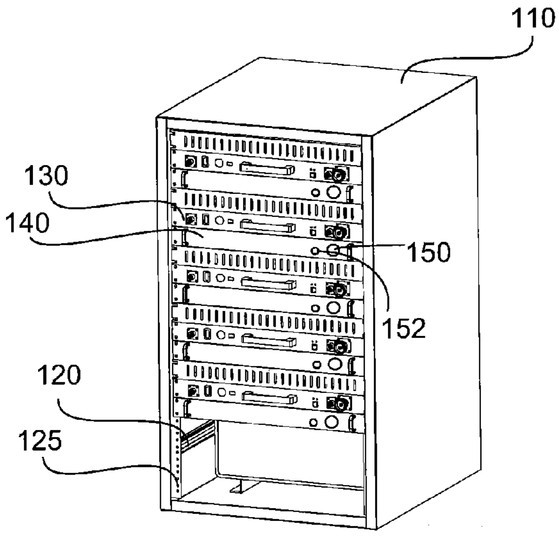
FIG. 1 is a front perspective view of an example support structure in which a number of components are mounted.

It will be appreciated that for simplicity and clarity of illustration, where considered appropriate, reference numerals may be repeated among the figures to indicate corresponding or analogous elements. In addition, numerous specific details are set forth in order to provide a thorough understanding of the example embodiments described herein. However, it will be understood by those of ordinary skill in the art that the example embodiments described herein may be practiced without these specific details. In other instances, well-known methods, procedures and components have not been described in detail so as not to obscure the example embodiments described herein. Also, the description is not to be considered as limited to the scope of the example embodiments described herein.

In modular systems, multiple electrical components are often mounted in a support structure such as a rack or chassis. For example, high power electronics such as cellular transmitters utilize large, regulated power sources. These power sources may be modular electrical components such as power amplifier modules. To remove generated heat, heat exchangers may be coupled to the power amplifier modules, and the heat exchanger and power amplifier module combination may be mounted.

The support structure may also provide fluid conduits having a fluid interface with the heat exchanger for circuiting heat exchanger fluids (such as a liquid like oil, water or anti-freeze for example) between the heat exchanger an external cooling system. One such interface is a blind mate liquid cooling connection whereby the heat exchanger may be connected with the fluid interface on the support structure without a user being able to see the physical connection point. When connected, the connection allows coolant fluids to travel between the heat exchanger and the cooling system. When the heat exchanger is disconnected from the system, connectors on both the heat exchanger and the cooling system close to prevent fluid from escaping from the connection points. However, for various reasons including partially mated connections and wear-and-tear from the repeated mating and unmating of the connectors, fluid leaks from the connectors can be a concern.

Reference is made to FIG. 1, which illustrates according to example embodiments a front perspective view of a support structure in the form of a rack 110 for mounting various modular, removable components such as electrical components 130 and heat exchangers 140. In some example embodiments, the rack 110 may be an equipment rack as illustrated in FIG. 1. This rack may be a standardized equipment rack such as a 19-inch rack or a 23-inch rack. In some example embodiments, the support structure may be a proprietary or non-standard size. In other example embodiments, the support structure may be a housing, frame, chassis, cabinet, circuit board or other structure capable of receiving modular components.

In some example embodiments, the rack 110 may include one or more rails 120 for slidably receiving one or more electrical components 130 and heat exchangers 140. In other example embodiments, the rack 110 may include shelves, rails, slots, slides, other electrical components, sub-racks or chasses, or other means for supporting the electrical components 130 and heat exchangers 140. In some example embodiments, the rack 110 may include additional means for securing an electrical component to the rack such as mounting holes 125 for receiving bolts, snaps, clips, latches, locks and the like. In some example embodiments, the rack may include latch components or mechanisms for releasing mounted electrical components 130 and heat exchangers 140.

While the electrical components 130 and heat exchangers 140 in FIG. 1 are mounted in the rack 110 in a horizontal orientation, in other example embodiments, the electrical components 130 and heat exchangers 140 may be mounted vertically or in any other orientation.

In some example embodiments, the rack 110 includes electrical busses or other means for providing power to mounted electrical components 130 and heat exchangers 140. In some example embodiments, the rack 110 may include busses or conductors for exchanging signals with electrical components 130 or heat exchangers 140 and providing internet or telecommunication network connections to mounted components. As will be explained in greater detail below, in the illustrated embodiment the rack 110 includes conduits or passages for providing and retrieving a heat exchange fluid such as a cooling liquid to and from locations throughout the stack 110 for heat exchangers 140.

In some example embodiments, the rack 110 may include a display for displaying status information about the mounted electrical components 130 or heat exchangers 140 or to display information provided by the mounted components. In some example embodiments, the rack 110 may include a keyboard or other input components for programming, monitoring, debugging, or otherwise controlling one or both of the mounted electrical components 130 or heat exchangers 140.

In some example embodiments, the rack 110 may include sensors, processors or circuitry for detecting the presence of one or both of mounted electrical components 130 or heat exchangers 140.

In the example configuration in FIG. 1, a number of separately mountable modular component pairs are mounted in the rack 110, with each pair including an independently mounted electrical component 130 and heat exchanger 140. As illustrated in FIG. 1, each electrical component 130 is paired with and positioned directly above a corresponding heat exchanger 140 in the rack 110. In the illustrated embodiment, each electrical component 130 has a lower surface thermally coupled to an upper surface of its paired heat exchanger 140.

Other arrangements of electrical components 130 and heat exchangers 140 are also possible. For example, in some example embodiments, the electrical component 130 may have an upper surface which may be thermally coupled to a lower surface of the heat exchanger. In these embodiments, the electrical component would be positioned directly below the heat exchanger in the rack.

In some example embodiments, the electrical component 130 may have both upper and lower surfaces that can be thermally coupled to heat exchanger. In these embodiments, a heat exchanger may be positioned directly above or directly below the electrical component. In some examples, the electrical component may be positioned between two heat exchangers to provide cooling to two surfaces of the electrical component. Similarly, in some example embodiments, a heat exchanger, having both an upper and a lower cooling surface, may be positioned between two electrical components to provide cooling to both components.

In some example embodiments, two smaller electrical components may be positioned in a single row of the rack. In these embodiments, if properly aligned, a single heat exchanger surface may provide cooling to both electrical components. In some embodiments, the electrical components 130 and heat exchangers may be vertically oriented, with vertically oriented thermally coupled surfaces.

Figure 2:
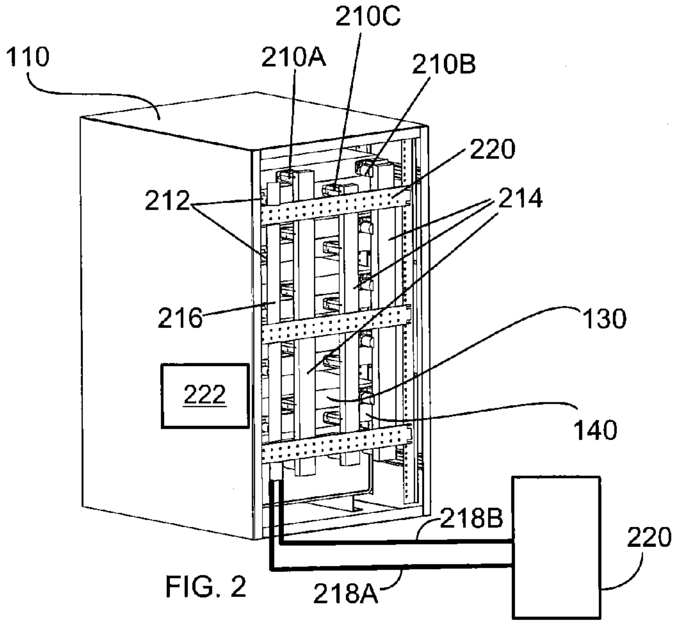
FIG. 2 is a rear perspective view of the example support structure of FIG. 1.

FIG. 2 illustrates a rear perspective view of the example rack of FIG. 1. In this example embodiment, the rack 110 has a series of quick connect connectors 210A and 210B mounted on quick connect collectors 215 for mating with corresponding quick connectors on the electrical components 130, and quick connect connectors 210C for mating with corresponding quick connectors on the heat exchangers 140. The quick connectors 210A/B/C allow releasable blind connections to be made between electrical components 130 and heat exchangers 140 and the rack 110 to allow for the transmission of one or more of power, electrical signals, internet communications, telecommunications and the like between the mounted components and the communications and power busses integrated into the rack 110. The quick connect collectors 215 that support quick connectors 210A, 210B and 210C can house power and communications busses and may be supported by support bars 220 of the rack 110. In the illustrated embodiment, the rack 110 also includes a column of quick connect fluid connectors 212 mounted on a heat exchanger fluid inlet/outlet conduit member 216 for mating with corresponding quick fluid connectors on the heat exchangers 140. The quick fluid connectors 212 allow releasable blind fluid connections to be made between heat exchangers 140 and the rack 110 to allow for heat exchanger fluid to be exchanged between the heat exchanger 140 and the conduit member 216. Inlet/outlet conduit member 216 can communicate through in and out flow lines 218A, 218B with an external heat exchanger system 220. In some example embodiments, quick connectors 210C provide a low current DC voltage to the heat exchangers 140.

In some example embodiments, instead of quick connections which may be connected by sliding a mountable component into the rack, the mounted components may require a user to manually connect the various ports or connections. In such embodiments, the connections may be connected to the rack or to other components via a cable, tube, cord or other suitable electronic or fluid communication means.

Figure 3:
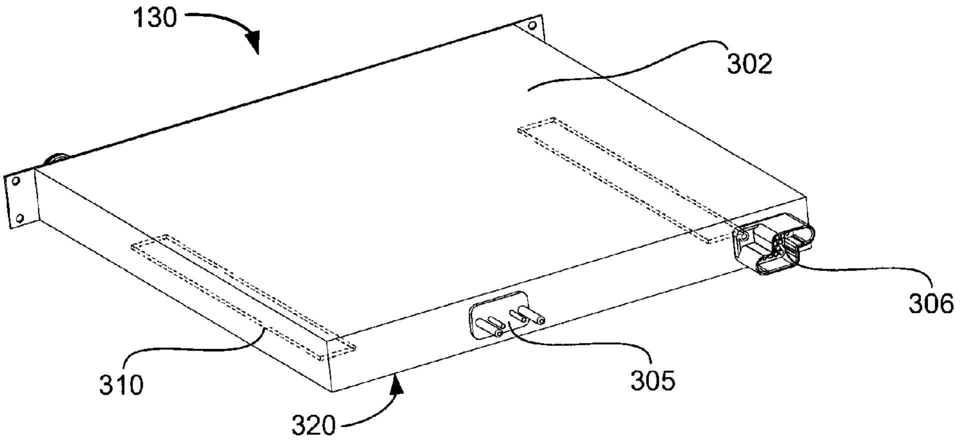
FIG. 3 is a perspective view of an example electrical component.

FIG. 3 illustrates a rear perspective view of an example electrical component 130. The electrical component 130 has one or more ports or quick connector ports 305, 306 for mating with rack quick connectors 210A, 210B, respectively for connecting power inputs or outputs, communication links or other electrical signals. FIG. 3 illustrates an example of an electrical component 130 with two different types of quick connectors 210A, 210B.

In some example embodiments, the electrical component 130 is a high voltage power amplifier for use with high voltage equipment such as cellular transmitter. In some example embodiments, the electrical component may be a computer or server. In some example embodiments, the electrical component may be a network or telecommunication component such as a switch or router. In some embodiments, different types of electrical components 130 or other modular components can be mounted in the same rack 110, including battery modules or other rack mounted components that are to be cooled or heated. The component 130 may be any component which can be cooled or heated by thermal coupling with a heat exchanger. In the illustrated figure, the component 130 has a rigid rectangular housing 302 dimensioned to be slid into a corresponding bay in the rack 110.

The example electrical component 130 in FIG. 3 has a substantially planar lower surface 320, at least a portion of which can be thermally coupled to a heat exchanger to transfer heat between the electrical component 130 and the heat exchanger 140. The example electrical component 130 has one or more magnetic regions in the form of magnetic strips 310 for magnetically attracting at least one external electromagnet. In some example embodiments, the magnetic strips 310 are disposed on the lower surface 320 of the housing 302 of the electrical component 130. While the magnetic strips 310 are illustrated as rectangular strips in FIG. 3, in other example embodiments, the magnetic regions may be any shape or size appropriate for attracting an external electromagnet. In some example embodiments, the magnetic strips 310 are positioned inside the electrical component proximal to the lower surface 320 of housing 302 such that the magnetic strips 310 can be magnetically attracted by an external electromagnet. In some example embodiments, the electrical component 302 may not have separate magnet strips 310—alternatively the magnetic regions may be integrated into the housing 302 such that at least a portion of the lower surface 320 of the housing 302 is made of a ferromagnetic material which can be magnetically attracted by an external electromagnet. In some example embodiments, the magnetic strips 310 may be active magnets, and in some embodiments, an electrical component 130 may have both magnets and a housing formed from or having portions that are formed from a ferromagnetic material.

In some embodiments, the electrical component 140 may have a thermally couplable portion on a top or side surface for thermally coupling to a heat exchanger positioned above or to the side of the component. Accordingly, in these example embodiments, the electrical component housing may have magnetic regions positioned on or proximate to the upper surface having the thermally couplable portion. In some example embodiments, the electrical component may have thermally couplable portions on multiple sides for coupling to multiple heat exchangers, and may have multiple corresponding magnetic regions.

Figure 4:
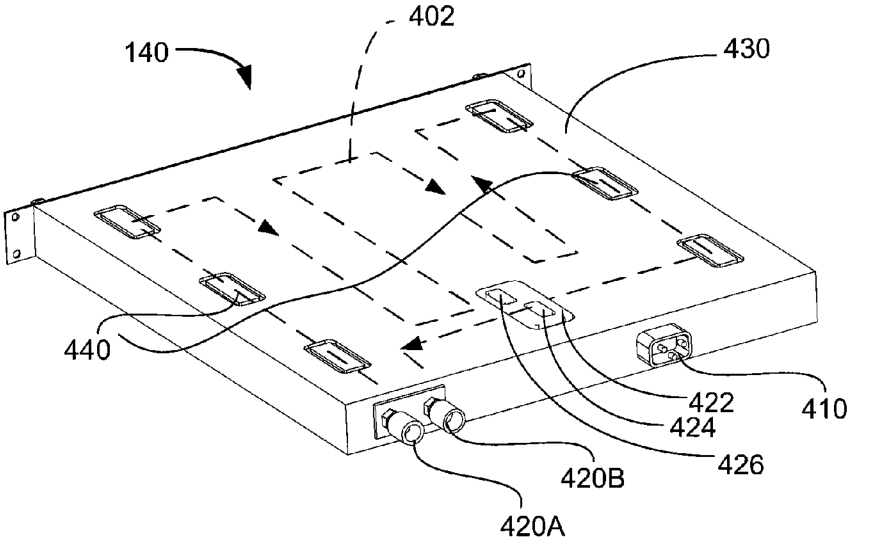
FIG. 4 is a perspective view of an example heat exchanger.

FIG. 4 illustrates an example of a rectangular, low profile modular heat exchanger module 140 for thermally coupling with the example electrical component 130 in FIG. 3. In some example embodiments, the heat exchanger 140 has a quick connect electrical connector 410 for blind mating with the quick connector 210C of rack 110. In example embodiments, the heat exchanger 140 has inlet/outlet quick fluid connectors 420A/420B for mating with corresponding inlet/outlet fluid connectors 212 of rack 110.

In some example embodiments, the heat exchanger 140 has a substantially planer upper surface 430 at least a portion of which can be thermally coupled with the lower surface 320 of its paired electrical component 130 to transfer heat between the electrical component 130 and the heat exchanger 140. In example embodiments, the heat exchanger 140 defines an internal fluid passage way, represented by dashed line 402 in FIG. 4, which may include pipes, tubes or other fluid conduits for moving fluid adjacent the heat exchanger surface 430 between heat exchanger fluid inlet connector 420A and outlet connector 420B. Heat exchanger fluid (which for example could be a cooling liquid or a heating liquid) enters the heat exchanger 140 through fluid connector inlet 420A and absorbs heat (in the case of a cooling liquid) received from the electrical component 130 via the thermally coupled portions of the electrical component 130 and the heat exchanger 140. After passing through internal passage 402 (which may include a serpentine passage as shown, or several parallel channels, or other flow configurations), the heat exchanger fluid exits the heat exchanger 140 though an outlet fluid connector 420B. The heat exchange fluid from multiple heat exchangers passes through the inlet/outlet conduit member 216 on its way to and from an external heat exchanger system 220 for cooling (or alternatively heating) the heat exchanger fluid. In some example embodiments, multiple heat exchanger conduit members 216 may be used to provide heat exchanger fluid to and retrieve heat exchanger fluid from the stack 110.

The example heat exchanger 140 includes one or more electromagnets 440 for magnetically attracting the magnetic strips 310 or other magnetic regions of its paired electrical component 130. The electromagnets 440 may be any shape or size appropriate for attracting an external magnet or ferromagnetic material on an adjacent electrical component 130. In some example embodiments, with a low voltage and low current, the electromagnets 440 provide a large holding force. In some example embodiments, with a DC voltage of around 12 V and a current of around 2 mA, the electromagnets 440 can provide a holding force of up to 1200 pounds. When electromagnets 440 are energized, the magnetic attraction between the electromagnets 440 and the magnetic strips/ferromagnetic material physically secures the electrical component 130 and the heat exchanger 140 in a thermally coupled position whereby the thermally couplable portion (for example lower surface 320) of the electrical component 130 is thermally connected to the thermally couplable portion (for example upper surface 430) of the heat exchanger 140. In some example embodiments, when in a thermally coupled position, the thermally couplable portion of the electrical component 130 is in physical contact with the thermally couplable portion of the heat exchanger 140.

In some example embodiments, the rack 110 may have mounting mechanisms which allow for some translation of mounted components to allow adjacent electrical components and heat exchangers to move into direct physical contact when electromagnets 440 are activated.

In some example embodiments, the electromagnets and magnets/ferromagnetic materials may be positioned to move the mounted components into an alignment such that there is an increased area of contact between the thermally couplable portion of the electrical component and the thermally couplable portion of the heat exchanger.

In some example embodiments, the electromagnets 440 are disposed on the upper surface 430 of the heat exchanger 140. In some example embodiments, the electromagnets 440 are positioned inside the heat exchanger 140 proximal to the upper surface 430 such that the electromagnets 440 can be magnetically attracted to an external magnet or ferromagnetic material.

In other example embodiments, the heat exchanger may have a thermally couplable portion on a bottom or side surface for thermally coupling to an electrical component positioned below or to the side of the heat exchanger. Accordingly, in these example embodiments, the heat exchanger may have electromagnets positioned on or proximate to the surface having the thermally couplable portion. In some example embodiments, the heat exchanger may have thermally couplable portions on multiple sides for coupling to multiple electrical components, and may have one or more electromagnets on or proximate to each thermally couplable side.

Figure 6:
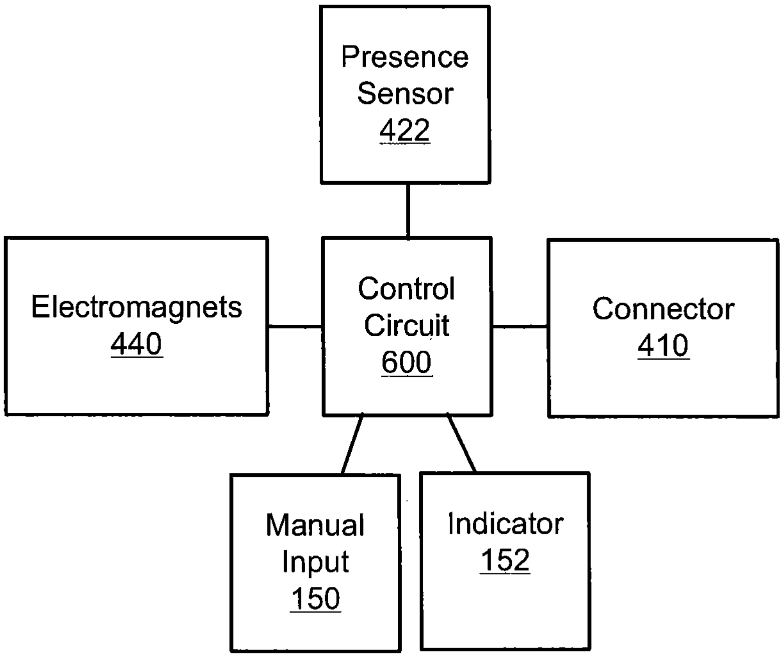
FIG. 6 is a block diagram of a magnetic lock circuit that can be applied to the components mounted in the support structure of FIG. 1.

When energized, electromagnets 440 provide a magnetic lock that physically secures the electrical component 130 and the heat exchanger 140 in a thermally coupled position in rack 110; when electromagnets 440 are de-energized, the magnetic lock is released. In an example embodiment, each heat exchanger 140 includes circuitry as illustrated diagrammatically in FIG. 6 for controlling the energizing and de-energizing of electromagnets 440. As shown in FIG. 6, the circuitry includes a switch or control circuit 600 which selectively provides power from quick connector 410 to electromagnets 440 based on input received from one or both of a proximity sensor 411 and a manual input 150. The circuitry of FIG. 6 can also include a status indicator 152, which for example could be a visual indicator such as one or more LEDs, to provide feedback to an operator as to the status of electromagnets 440.

In some example embodiments, the electromagnets 440 on a heat exchanger 140 can be manually de-energized when a manual input device 150 such as button or other switch is activated. By way of example, referring to FIG. 1, in some examples an input device 150 such as a button (which may for example be a one-shot monostable switch) is provided on the front of each heat exchanger 140, along with an LED indicator 152. When the control circuit 600 detects that the manual input 140 has been pressed or otherwise triggered, the circuit 600 cuts power flow from the connector 410 to the electromagnets 440, thereby de-energizing the electromagnets 440. The control circuit 600 also extinguishes or changes the color of the LED light 152 to indicate the magnetic lock has been released. When electromagnets 440 are de-energized, the magnetic lock is released and electrical component 130 is not secured to its paired heat exchanger 140, permitting the electrical component 130 to be removed independently from the front of the rack 110 without affecting its corresponding heat exchanger 140. Similarly, when the electromagnets 440 are de-energized, the heat exchanger 140 may be independently removed from the front of the rack 110 without affecting its corresponding electrical component 130. The button or switches 150 and indicator LEDs 152 may alternatively be located on the rack 110, or the electrical component 130, or be remotely operated. Although each heat exchanger/electrical component pair is shown in FIG. 1 as having an independent button 150 for releasing the magnetic lock binding the pair, in some examples a single input component could be used to control the magnetic lock for a plurality of heat exchanger/electrical component pairs. In some example embodiments, the manual input 150 can also be used to reenergize the electromagnets 440.

In some example embodiments, the electromagnets 440 for a heat exchanger 140/electronic component 130 pair is energized by control circuit 600 in response to signals received from a proximity or presence sensor 422. As shown in FIG. 4, in one example embodiment the presence sensor 422 is positioned on the heat exchanger 430 to detect when an electrical component 130 is located in the rack 110 immediately above the heat exchanger 430. Such a sensor 422 could include for example a transmitter 424/detector 426 pair (such as an infrared transmitter/detector, LED transmitter/detector, or electromagnetic radiation transmitter/detector) or a mechanical switch to detect when corresponding electrical component 130 is mounted in the rack 110 immediately adjacent the heat exchanger 140. In some embodiments, the control circuit 600 will only re-energize electromagnets 440 when heat exchanger power connector 410 is connected to receive power from the rack connector 210C at the same time that the sensor 422 detects that the paired electrical component 130 is present.

The sensor 422, manual input 150 and control circuit of the circuit of FIG. 6 could take a number of different configurations other than as described above. For example, in some example embodiments, the sensor may be one or more proximity sensors mounted on the rack 110 such as an infrared or LED transmitter and corresponding receiver which detects that the electrical component 130 and its corresponding heat exchanger 140 are correctly mounted in the rack 110. In some example embodiments a proximity sensor 154 may detect when the back of the electrical component 130 and the back of the immediately adjacent heat exchanger 140 is in close proximity to the rear of the rack thereby indicating that the electrical component 130 and its associated heat exchanger 140 are mounted and/or connected to a rack connector. In some example embodiments, the sensor 154 may include, in addition to or instead of a light transmitter and receiver, one or more of a pressure sensor, a capacitive sensor or any other sensor suitable for detecting the presence of a nearby component. In example embodiments described herein, the sensor 154 may include components on one or more of the electrical component, the rack or the heat exchanger. In some example embodiments, a sensor 422 may include components for sensing when an electrical component 130 is connected to a power source via a rack connector, and first receives power to turn on the electrical component 130. In some example embodiments, the sensor may be triggered by an initial boot sequence of the electrical component 140.

In the above example embodiments, an electromagnet on a heat exchanger is magnetically attracted to a magnet or magnetic region of an electrical component. However, in other example embodiments, the electromagnet may be on the electrical component and may be magnetically attracted to a magnet or magnetic region on a heat exchanger. In some example embodiments, both the heat exchanger and the electrical component may each have electromagnets and magnets/ferromagnetic materials for magnetically attracting corresponding magnets/ferromagnetic materials and electromagnets on the opposite component.

The circuitry of FIG. 6 could alternatively be provided on electrical components 130 in the case where the electromagnets 440 are provided on components 130. Some of the elements of the circuitry of FIG. 6 could be provided on the rack 110, and although FIG. 6 shows a circuit for controlling the magnetic locks for a single component/heat exchanger pair, the circuitry of FIG. 6 could alternatively be configured to control the magnetic locking of multiple heat exchanger/electric component pairs instead of or in addition to controlling each heat exchanger/electric component pair independently. For example, control circuit 600 could be a central circuit (implemented for example by a computing device or other logic circuit) for the entire rack 110 or a plurality of racks 110 that monitors all of the rack bays and tracks in real time where electrical components 130 and heat exchangers 140 are located in the rack 110. When the control circuit 600 receives a signal (for example from a manual input 150) associated with a monitored electrical component 130 or heat exchanger 140, it can de-energize the electromagnets 440 at a location in rack 110 associated with the signal, allowing the associated electrical component 130 or heat exchanger 140 to be removed for servicing. Upon re-installation of the electrical component 130 or heat exchanger 140, the control circuit 600 receives a signal from one or more presence sensors 422 indicating that the electrical component 130 (or heat exchanger 140) is back in location, with the result that the control circuit reenergizes the relevant electromagnets 440 to magnetically lock the electrical component 130 and heat exchanger 140 into a thermally coupled position.

Figure 5:
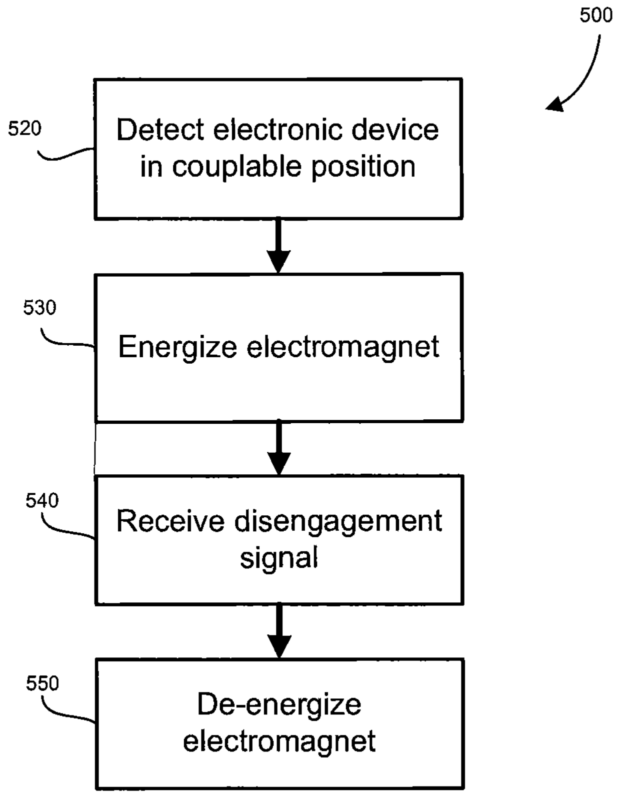
FIG. 5 is a flowchart of an example method of cooling an electrical component.

Referring to FIG. 5, an example method 500 of operating the circuitry of FIG. 6 to control a heat exchanger system is illustrated. At action 520, an electrical component 130 is detected to be in couplable position. In some example embodiments, the electrical component 130 is detected to be in a couplable position when it is in couplable proximity to a heat exchanger 140 in the rack 110. In some example embodiments, the electrical component 130 is detected to be in a couplable position when the thermally couplable portions of the electrical component 130 and an adjacent heat exchanger 150 are at least partially aligned.

In some example embodiments, the electrical component 130 is detected to be in a couplable position by a sensor 422 as described above. In some example embodiments, the electrical component 130 is detected to be in a couplable position when it is mounted in a rack 110 adjacent to a heat exchanger 140. The electrical component 130 may be detected to be in a couplable position irrespective of the order in which the electrical component and heat exchanger are mounted in the rack. In some example embodiments, an electrical component mounted in a rack may be detected to be in a couplable position when a heat exchanger is subsequently mounted adjacent to the electrical component. In some example embodiments, in addition to or instead of a sensor, a manual input could be operable to energize electromagnets 440 when the electrical component and heat exchanger are located in a thermally couplable position.

In some example embodiments, the electrical component is detected to be in a couplable position when an input component 150 such as a button or switch' is activated. In some example embodiment, a user may select a menu option, click a button or otherwise execute a command from a computer user interface to send a signal indicating that the electrical component 130 is in a couplable position. In some example embodiments, a user may actuate a mouse, touchscreen, keyboard or any other input component to indicate that the electrical component is in a couplable position.

At action 530, upon detection that the electrical component 130 is in a couplable position, one or more electromagnets 440 on one or both of the heat exchanger 140 and adjacent electrical component 130 are energized to magnetically secure the electrical component 130 and the adjacent heat exchanger 140 in a thermally coupled position. The energized electromagnet 440 is attracted to a magnetic region of the housing or a magnetic strip secured to the housing of the other component. This magnetic force secures the electrical component 130 and its respective heat exchanger 140 in a thermally coupled position.

In some example embodiments, the electrical component and the heat exchanger may be in close proximity to one another but may not be in physical or thermal contact prior to energizing of electromagnets 440. In these embodiments, the energized electromagnet creates a magnetic force causing the electrical component or the heat exchanger to move into physical contact. The magnetic force locks the electrical component and the heat exchanger in this thermally coupled position. In example embodiments, a visual indicator 152 such as an LED is activated to indicate that the magnetic lock is energized.

Once thermally coupled, heat from the electrical component 130 may be transferred to the heat exchanger 140 thereby cooling the electrical component 130, with the heat exchanger fluid travelling through heat exchanger passage 402 drawing the heat off to an external cooling system 220. Alternatively, in some applications heat from the heat exchanger 140 may be transferred to the component 130 thereby heating the component 130, with the heat exchanger fluid travelling through heat exchanger passage 402 drawing heat from an external heating system 220.

At action 540, the component 130 or 140 having the electromagnet(s) 440 may receive a disengagement signal. A user wishing to uncouple the electrical component from the heat exchanger may trigger a disengagement signal. In some example embodiments, the disengagement signal may be the activation of an input component 150 such as a switch or a button.

In some example embodiments, the disengagement signal may be a signal from a processor, controller, control circuit, software module or any other electrical component. In some example embodiments, a user may select a menu option, click a button or otherwise send a disengagement command from a computer user interface to send a disengagement signal. In some example embodiments, a user may actuate a mouse, touchscreen, keyboard or any other input component to send a disengagement command.

At action 550, upon receipt of the disengagement signal, the electromagnet 440 is de-energized. Once the electromagnet 440 is de-energized, the electrical component 130 and heat exchanger 140 are no longer magnetically locked in a thermally coupled position, and either one of the electrical component 130 or heat exchanger 140 may independently be removed from the rack 110 while the other component stays mounted in the rack 110.

In some example embodiments, as the system described above allows an electrical component 130 to be removed from the rack 110 for servicing or replacement independently of its associated heat exchanger 130, the fluid connections between the heat exchanger 130 and the inlet/outlet fluid conduit 216 do not have to be separated during servicing or replacement of the electrical component 130. This may in some applications reduce wear and tear on the fluid connectors 212, 420A, 420B and reduce the chance of fluid leaks occurring from worn connectors or miss-installed heat exchangers. Furthermore, the decoupling of the electrical component 130 from its heat exchanger 140 means that a technician servicing the electrical component 130 does not have to lift and remove the weight of the heat exchanger 140 when servicing or replacing the electrical component 130. This flexibility can be obtained without substantially sacrificing thermal exchange performance as the magnetic locking of the heat exchanger 130 to its heat exchanger 140 during operation provides thermal coupling to facilitate heat exchange between the two components.

Figure 7:
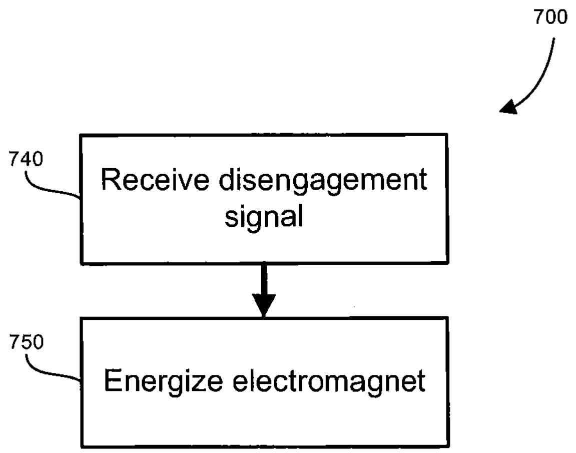
FIG. 7 is a flowchart of another example method of cooling an electrical component.

With references to FIG. 7, another example embodiment of a heat exchanger system will now be described. The system illustrated by the method of FIG. 7 is identical in operation and construction to the embodiments described above except that magnetic regions or strips 310 are replaced with powerful rare-earth permanent magnets such as Samarium Cobalt (SmCo) and Neodymium Iron Boron (NdFeB) magnets. In such an embodiment, the magnetic strips 310 attract electromagnets 440 with sufficient force to magnetically secure the heat exchanger 140 and electrical component 130 together in a thermally coupled position when the electromagnets are not energized. In order to release the heat exchanger 140 and electrical component 130 from each other, the electromagnets 440 are energized to provide the same polarity of magnetism as the magnetic strips 310 the electromagnets 440 are facing in order to repel the magnetic strip 310 so that the electrical component 130 can be removed from the heat exchanger 140. In an example embodiment, the electromagnets 440 and magnetic strips 310 may be configured so that when the electromagnets 440 are not energized a force of a hundred or more pounds is required to separate the components, but when the electromagnets 440 are energized, a much lower force is required to separate the components. Thus, in such an embodiment, as shown in method 700 of FIG. 7, a disengagement signal (step 740) from manual input 150 actually causes electromagnets 440 to become energized (step 750)—the opposite of method 500 of FIG. 5. The electromagnet 440 are de-energized to secure the electrical component 130 back in place relative to its corresponding heat exchanger 140.

While the embodiments described herein are directed to particular implementations of systems and methods for cooling or heating modular components such as electrical components, it will be understood that modifications and variations may occur to those skilled in the art having read the present disclosure. All such modifications and variations are believed to be within the sphere and scope of the present disclosure.

What is claimed is:

1. A magnetic lock system for releasably securing a heat exchanger with a component, the system comprising:

an electromagnet on one of the heat exchanger or the component and a magnetic region on the other of the heat exchanger or the component;

the electromagnet being energizable to attract the magnetic region to secure the component and the heat exchanger in a thermally coupled position; and the electromagnet being de-energizable to release the component and the heat exchanger from the thermally coupled position.

2. The magnetic lock system of claim 1 comprising a circuit for de-energizing the electromagnet in dependence on receiving a first input and energizing the electromagnet in dependence on receiving a second input.

3. The magnetic lock system of claim 2 comprising a manual input for providing the first input and a presence sensor for providing the second input.

4. The magnetic lock system of claim 3 wherein the presence sensor provides the second input upon detecting that the heat exchanger and component are in a thermally couplable position.

5. The magnetic lock system of claim 4 wherein the presence sensor includes one or more of an infrared transmitter and receiver, a LED transmitter and receiver and an electromagnetic radiation transmitter and receiver.

6. The magnetic lock system of claim 5 wherein the manual input is a user input button or switch.

7. The magnetic lock system of claim 1 wherein the component is a heat generating electrical component, and the heat exchanger defines at least one internal passage for a cooling fluid for removing heat from the heat exchanger.

8. The magnetic lock system of claim 1 including a heat exchanger with the electromagnet provided thereon.

9. The magnetic lock system of claim 1 including a component with the electromagnet provided thereon.

10. The magnetic lock system of claim 9 wherein the component is a high power amplifier for a communications antenna.

11. A component mounting system comprising:

a support structure;

a heat exchanger mounted to the support structure;

a component adapted to be removably mounted to the support structure;

an electromagnet on one of the heat exchanger or the component and a magnetic region on the other of the heat exchanger or the component;

the electromagnet being energizable to attract the magnetic region to secure the component and the heat exchanger in a thermally coupled position when the heat exchanger and the component are located adjacent each other in the support structure; and the electromagnet being de-energizable to release the component and the heat exchanger from the thermally coupled position to allow the component to be removed independently of the heat exchanger from the support structure.

12. The component mounting system of claim 11 wherein the support structure and the component include corresponding electrical connectors that mate when the component is mounted to the support structure.

13. The component mounting system of claim 12 wherein the heat exchanger defines at least one internal fluid path for a heat exchanger fluid, the heat exchanger being removably mounted to the support structure, the support structure and the heat exchanger including corresponding fluid connectors that mate when the heat exchanger is mounted to the support structure for routing heat exchange fluid to and from the internal fluid path of the heat exchanger.

14. The component mounting system of claim 13 wherein the electromagnet is provided on the heat exchanger and the heat exchanger and support structure include corresponding electrical connectors that mate when the heat exchanger is mounted to the support structure.

15. The component mounting system of claim 11 including a sensor for detecting when the heat exchanger and the component are located adjacent each other in the support structure, a manual input device, and a circuit for de-energizing the electromagnet in response to triggering of the manual input device and re-energizing the electromagnet in response to a signal from the sensor indicating the component is located adjacent the heat exchanger in the support structure.

16. The component mounting system of claim 15 wherein the sensor includes one or more of an infrared transmitter and receiver, a LED transmitter and receiver and an electromagnetic radiation transmitter and receiver, and the manual input device includes a user input button or switch.

17. The component mounting system of claim 11 wherein the component is an electronic component and the support structure is an equipment rack having multiple bays for receiving multiple components adjacent heat exchangers, the system including a control system for de-energizing selected electromagnets to selectively thermally de-couple components from their respective heat exchangers and for energizing selected electromagnets to selectively thermally couple components to their respective heat exchangers.

18. The component mounting system of claim 17 wherein the control system is configured to de-energize selected electromagnets upon receiving predetermined input signals and to energize selected electromagnets upon receiving signals indicating the presence of a component at a location associated with the selected electromagnets.

19. The component mounting system of claim 11 wherein the component is a power amplifier.

20. A method of releasably securing an electronic component to a heat exchanger, the heat exchanger defining an internal fluid flow path for a heat exchanger fluid flowing therethrough, the method comprising:

providing one or more electromagnets on one of the heat exchanger or the component and one or more magnetic regions on the other of the heat exchanger or the component;

energizing the one or more electromagnets to attract the one or more magnetic regions to secure the component and the heat exchanger in a thermally coupled position; and de-energizing the one or more electromagnets to release the component and the heat exchanger from the thermally coupled position.

21. A magnetic lock system for releasably securing a heat exchanger with a component, the system comprising:

an electromagnet on one of the heat exchanger or the component and a magnet on the other of the heat exchanger or the component;

magnetic attraction between the magnet and the electromagnet securing the component and the heat exchanger in a thermally coupled position when the electromagnet is not energized, the electromagnet being energizable to repel the magnet to release the component and the heat exchanger from the thermally coupled position 22. A method of releasably securing an electronic component to a heat exchanger, the heat exchanger defining an internal fluid flow path for a heat exchanger fluid flowing therethrough, the method comprising:

providing one or more electromagnets on one of the heat exchanger or the component and one or more magnets on the other of the heat exchanger or the component;

positioning the component and the heat exchanger adjacent each other so that magnetic attraction between the one or more electromagnets and the one or more magnets secure the component and the heat exchanger in a thermally coupled position; and energizing the one or more electromagnets to release the component and the heat exchanger from the thermally coupled position.

* * * * *